United States Patent [19]

Kub

[11] Patent Number: 4,549,196
[45] Date of Patent: Oct. 22, 1985

[54] LATERAL BIPOLAR TRANSISTOR

[75] Inventor: Francis J. Kub, Pasadena, Md.

[73] Assignee: Westinghouse Electric Corp., Pittsburgh, Pa.

[21] Appl. No.: 405,000

[22] Filed: Aug. 4, 1982

[51] Int. Cl.[4] .................... H01L 29/72; H01L 29/06
[52] U.S. Cl. .......................................... 357/35; 357/55
[58] Field of Search .................................. 357/35, 55

[56] References Cited

U.S. PATENT DOCUMENTS

| | | |
|---|---|---|
| 3,197,710 | 7/1965 | Lin . |
| 4,135,950 | 1/1979 | Rittner .................................. 357/55 |
| 4,314,269 | 2/1982 | Fujiki . |
| 4,451,843 | 5/1984 | Dahlberg .............................. 357/55 |

OTHER PUBLICATIONS

"On Etching Very Narrow Grooves in Silicon", *Applied Physics Letters*, vol. 26, No. 4, Feb. 1975, by Don L. Kendall.
H. Berger, "Method of Producing a Lateral Transistor", IBM Tech. Disc. Bull., vol. 23, pp. 1089–1090 (Aug. 1980).

*Primary Examiner*—Martin H. Edlow
*Assistant Examiner*—Terri M. Henn
*Attorney, Agent, or Firm*—J. R. Hanway

[57] ABSTRACT

A lateral bipolar transistor is described incorporating at least two grooves extending from the upper surface and spaced apart by a predetermined amount from which impurities are introduced to form an emitter region extending from the sidewall of one groove and a collector region extending from the sidewall of an adjacent groove with the base being the substrate material between the two regions. A plurality of grooves may be utilized to form a plurality of transistors with the grooves staggered to facilitate access to the ends of the grooves functioning as emitters and those functioning as collectors. The large vertical junction area formed by the side walls relative to the horizontal junction area at the bottom of the grooves and the uniform base width result in a high current gain lateral transistor.

10 Claims, 12 Drawing Figures

LATERAL BIPOLAR TRANSISTOR

BACKGROUND OF THE INVENTION

1. Field of the Invention

This invention relates to bipolar transistors and more particularly to a lateral bipolar transistor useful alone or in combination with other transistors in integrated circuit form.

2. Description of the Prior Art

In the prior art lateral PNP bipolar transistors have been fabricated alone or with vertical NPN transistors. The lateral bipolar structure comprises two regions, emitter and collector, spaced apart of a first conductivity type with a third region, base, of a second conductivity type sandwiched therebetween. The separation between the first and second region determines the base width of the transistor. If the emitter current from the emitter region is injected along the total junction between the emitter and base, then the lateral injected current opposite the collector will participate in transistor action. The lateral emitter current injected away from the collector and the emitter current injected vertically transverse to the collector direction will most likely not participate in transistor action. The vertical emitter current is large due to the large horizontal junction area of the emitter region. A large portion of the injected emitter current is lost to recombination in the base region if not in the proximity of the collector. Consequently, the current gain or $\alpha$ of the present lateral transistor is low. The current gain $\alpha$ is determined by dividing the collector current $I_C$ by the emitter current $I_E$.

In typical lateral PNP transistors, the component of current injected vertically from the emitter can be equal to or larger than the component injected laterally towards the collector because of the difference in horizontal to vertical junction area of the emitter. This is true even if the geometry permits a double sided emitter. In addition, if the emitter region is formed by diffusion into the base, the diffusion profile is sloped on the sides or edges which provides only a very small emitter junction area where the base width is narrowest. Transistor efficiency is further degraded by an emitter junction area with non-uniform base width. The frequency response of a lateral PNP transistor is determined by the diffusion constant D divided by the square of the diffusion length L. The non-uniform base width for a lateral PNP transistor provides longer diffusion lengths for the carriers which, in turn, reduces the frequency response $f_t$.

One example of a lateral PNP transistor which may be formed with vertical NPN devices on the same integrated circuit chip is described in U.S. Pat. No. 3,197,710 which issued on July 27, 1965 to H. C. Lin entitled "Complementary Transistor Structure" which is assigned to the assignee herein. In U.S. Pat. No. 3,197,710 a complementary bipolar transistor structure is shown comprising a lateral PNP transistor with a vertically diffused NPN transistor such as shown in FIGS. 6 and 7. Both NPN and PNP transistors are made concurrently through a sequence of masking and diffusion steps. The PNP transistor structure shows an emitter as a dot diffused into an N region. The collector is formed by diffusing a ring or doughnut around the emitter having a constant space therebetween. The space between is the base of the PNP transistor and has constant base width in all directions radially as a function of depth from the emitter. The lateral PNP transistor shown in FIG. 6 or 7 is superior to a vertical PNP diffused transistor because it requires a large number of process steps, particularly diffusion operations which require a high degree of control. If any one of the several diffusion steps is performed improperly, an unsatisfactory vertical PNP bipolar transistor results. As stated in column 2 of U.S. Pat No. 3,197,710 the lateral PNP transistor "will not, in general, have sufficient gain to adequately perform as a transistor amplifier. Hence, in practically all applications where a complementary pair of transistor amplifiers is desired, the lateral transistor structure serves as a phase inverter and its output is amplified by the more" conventional vertical NPN transistor.

A semiconductor resistor is described in U.S. Pat. No. 4,314,269 by K. Fujiki which issued on Feb. 2, 1982 and filed prior to the invention herein. The resistor is formed by a conductivity layer on an internal side surface of a groove formed in semiconductor material of opposite conductivity type than the layer.

It is, therefore, desirable to provide a lateral bipolar transistor structure that has high current gain and good frequency response.

It is further desirable to provide a lateral bipolar transistor structure having a large component of emitter current injected laterally because of a large vertical junction area of the emitter compared to the current injected vertically from the horizontal junction area of the emitter.

It is further desirable to provide a lateral bipolar transistor structure having a uniform base width between the vertical junction areas of the emitter and collector which is easily and precisely controlled.

It is further desirable to provide a lateral PNP structure which can be incorporated with a conventional vertical NPN bipolar transistor process to form both PNP and NPN transistors concurrently in a semiconductor substrate.

SUMMARY OF THE INVENTION

In accordance with the present invention, a bipolar transistor is described comprising a substrate of semiconductor material doped with impurities of first type, the substrate having a plurality of spaced-apart grooves, the two adjacent sidewalls of two adjacent grooves each doped with impurities of a second type to form the emitter and collector regions of a bipolar transistor.

The invention further includes a method for forming a bipolar transistor as described above which may, for example, be a PNP transistor formed concurrently with a vertical NPN bipolar transistor.

DESCRIPTION OF THE PREFERRED EMBODIMENT

Figure 1:
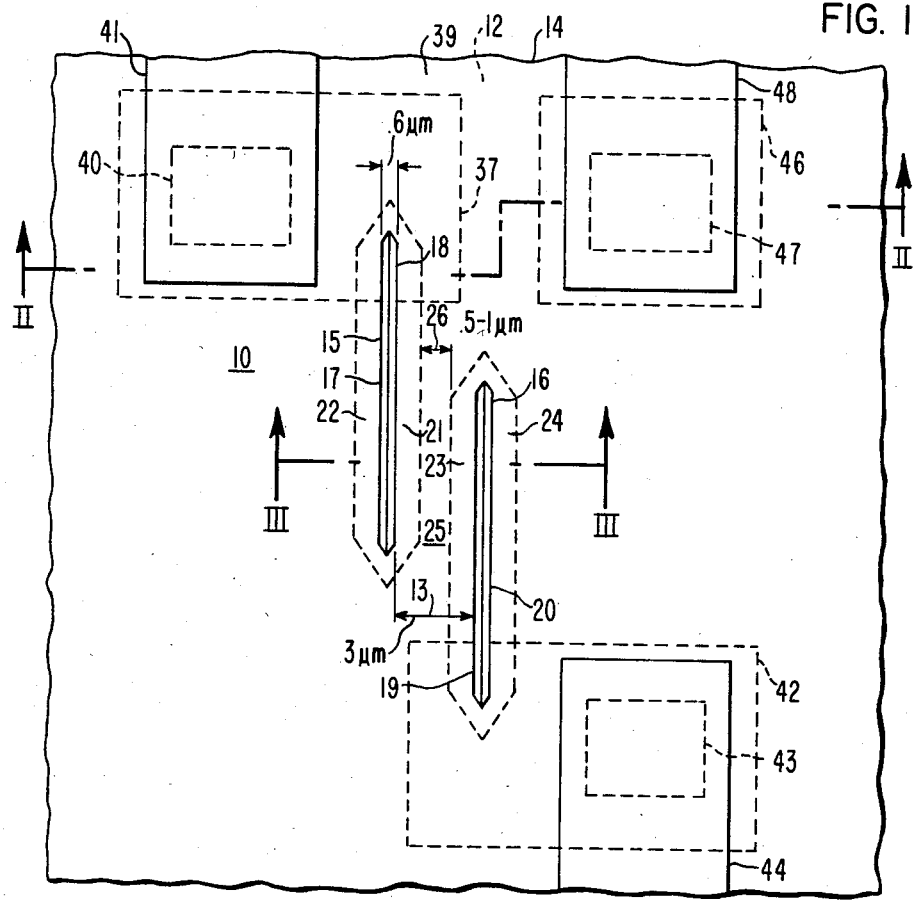
FIG. 1 is a plan view of one embodiment of the invention.

Referring to the drawing and in particular to FIG. 1 a bipolar transistor 10 is shown formed in the upper surface 12 of substrate 14. Substrate 14 may, for example, be comprised of semiconductor material such as silicon, germanium or Group III-V compounds such as Gallium Arsenide. If substrate 14 is silicon for purposes of description, the upper surface 12 may be in the (110) plane to facilitate the formation of narrow grooves 15 and 16. Substrate 14 may be doped with impurities of a first type such as N-type having a concentration in the range from 1 to $5 \times 10^{16}$ atoms/cm$^3$. Substrate 14 may also be an epitaxial layer over another layer or substrate.

Substrate 14 has slots or grooves 15 and 16 which are spaced apart shown by arrow 13 and extend from upper surface 12 into substrate 14. Groove 15 functions to provide internal surfaces or sidewalls 17 and 18 which are formed in the longitudinal direction of the groove. Groove 16 has sidewalls 19 and 20 which are formed in the longitudinal direction of the groove. Grooves 15 and 16 may be formed by etching using a mixture of potassium hydroxide and water. If grooves 15 and 16 are longitudinally aligned with the intersection of the (111) plane with upper surface 12 which is in the (110) plane, then very narrow grooves may be formed with an etchant having an etch rate of 400 to 1, depth to width, as described in a publication entitled "On Etching Very Narrow Grooves in Silicon" by Don L. Kendall found in *Applied Physics Letters*, Volume 26, No. 4, Feb. 15, 1975, pp. 195-198. The bottoms of the grooves typically are not flat or at a constant depth. The bottom of the grooves slopes upward near the longitudinal ends of the groove at an angle of 35° with respect to the longitudinal direction. Transverse to the groove, the bottom slopes from the sidewall downward towards the middle along crystal planes.

An alternate method of forming narrow grooves adjacent one another is by plasma etch. If plasma etch is used, the crystalline orientation of the silicon is not restricted. Plasma etch may be used where the upper or major surface of silicon is in the (111) plane or (100) plane.

If plasma etch is used, other geometries besides parallel grooves may be formed. For example, a series of concentric grooves or slots in the form of circular rings or rectangles may be formed in place of parallel grooves.

Figure 2:
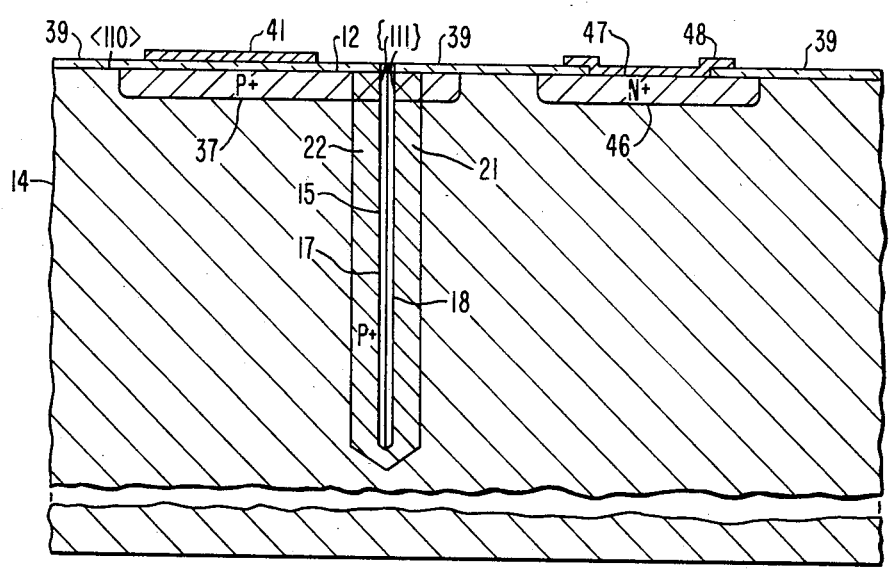
FIG. 2 is a cross-section view along the lines II—II of FIG. 1.
Figure 3:
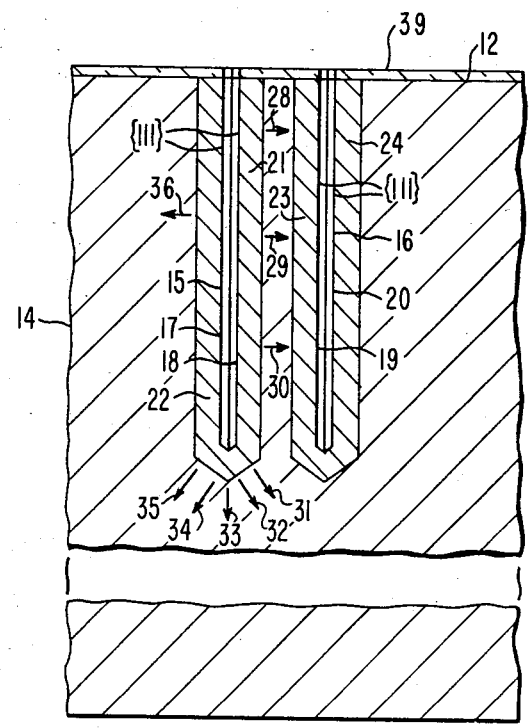
FIG. 3 is a cross-section view along the lines III—III of FIG. 1.

FIG. 2 shows a cross-section view along the line II—II of FIG. 1. FIG. 3 shows a cross-section view along the line III—III of FIG. 1.

Region 21 extending from sidewall 18 is formed by introducing impurities of a second type, such as P-type impurities, into sidewall 18 such as by gaseous deposition and a drive diffusion. Region 22 extending from sidewall 17 is also formed from impurities of a second type as a consequence of introducing impurities into sidewall 17 at the time they are introduced into sidewall 18. Region 23 is formed by introducing impurities of the second type into sidewall 19 of groove 16. Region 24 is formed by impurities of the second type being introduced through sidewall 20 of groove 16 at the time of introducing impurities into sidewall 19. Regions 21 through 24 may have a depth of 1 micrometer with respect to sidewalls 18, 17, 19 and 20, respectively. If the adjacent sidewalls of grooves 15 and 16 are spaced 3 micrometers apart, as shown by arrow 13 in FIG. 1, and regions 21 and 23 extend from sidewalls 18 and 19 by 1 micrometer, then a width of about 1 micrometer exists between regions 21 and 23 of substrate material of the first type and called region 25.

The depth of grooves 15 and 16 determines the distance regions 21 and 23 extend from the surface to below surface 12 and hence the vertical junction distance formed by regions 21 and 25 and regions 23 and 25. The longitudinal length of grooves 15 and 16 when multiplied by the vertical junction distance along the groove determines the vertical junction area. The depth of the grooves may be a predetermined distance from the surface to provide the vertical junction area desired between regions. Grooves having a depth in the range from 12 to 20 micrometers are well within current processing capabilities.

The emitter junction area should be large enough to provide adequate transistor Beta at the maximum collector currents expected. Insufficient emitter junction area will result in a drop or roll-off in Beta at high collector currents. The junction depth or groove depth may slope upwards at an angle of 35° to the upper surface at the end of the grooves. The slope at each end of the groove may extend from the end of the groove for a distance of about 1.4, cotangent of 35°, multiplied by the maximum depth of the groove.

Bipolar transistor 10 has been formed with region 21 acting as the emitter, region 23 acting as the collector or vice versa, and region 25 acting as the base. It is desirable that region 25 has a uniform width in the range from 0.5 to 1 micrometers to provide typically good bipolar transistor characteristics in frequency and collector emitter breakdown voltage. The base width or width of region 25 shown by arrow 26 determines in part the frequency response of the transistor. Equation 1 shows the relationship between $f_t$ and base width $W_B$ where $D_P$ is the diffusion constant for carriers in the P-type material of regions 21 and 23.

$$f_t = D_P / W_B^2 \qquad (1)$$

For N-type material, $D_N$ may be used for the diffusion constant.

The doping level of region 25 may be that of the original substrate which should be high enough to support a collector emitter breakdown or punch through voltage $BV_{ce}$ desired for the transistor. For example, with a 1 micrometer base width and a concentration of $5 \times 10^{16}$ atoms/cm, $BV_{ce}$ of the transistor would be approximately 15 volts. Lower concentration of doping would correspond to a lower voltage for $BV_{ce}$. Also a smaller base width would correspond to a lower breakdown voltage $BV_{ce}$.

FIG. 3 shows the emitter current represented by arrows 28-35 extending from region 21. The emitter current has two components, one laterally shown by arrows 28 through 30 and a vertical component shown by arrows 31 through 35. As can be seen in FIG. 3, the vertical junction area providing lateral current far exceeds the horizontal or near horizontal junction area providing vertical current which is a key feature of the structure of transistor 10. Arrow 36 shows current injected from region 22 which is lost if a transistor is not formed in this direction. A double sided emitter is preferred (see FIG. 4).

Ohmic contact is made to region 21 by a P+ diffusion region 37 which may be 2 microns deep. Region 37 intersects with groove 15 and regions 22 and 21. Upper surface 12 is coated with a layer of dielectric such as silicon dioxide 39 which may, for example, be silox which is a vapor-deposited oxide. An opening 40 in silicon oxide 39 over region 37 permits ohmic contact between conductor 41 and region 37. A P+ region 42 is formed in substrate 14 having a depth of 2 microns which intersects with groove 16 and regions 23 and 24. An opening 43 is formed in silicon dioxide layer 39 above region 42 to permit ohmic contact between conductor 44 and region 42.

An N+ region 46 is formed in substrate 14 having a depth of approximately 2 microns. An opening 47 is formed in silicon dioxide layer 39 above region 46 to permit ohmic contact between conductor 48 and region 46. Conductors 41, 44 and 48 may, for example, be polysilicon material or a metalization such as aluminum.

Figure 4:
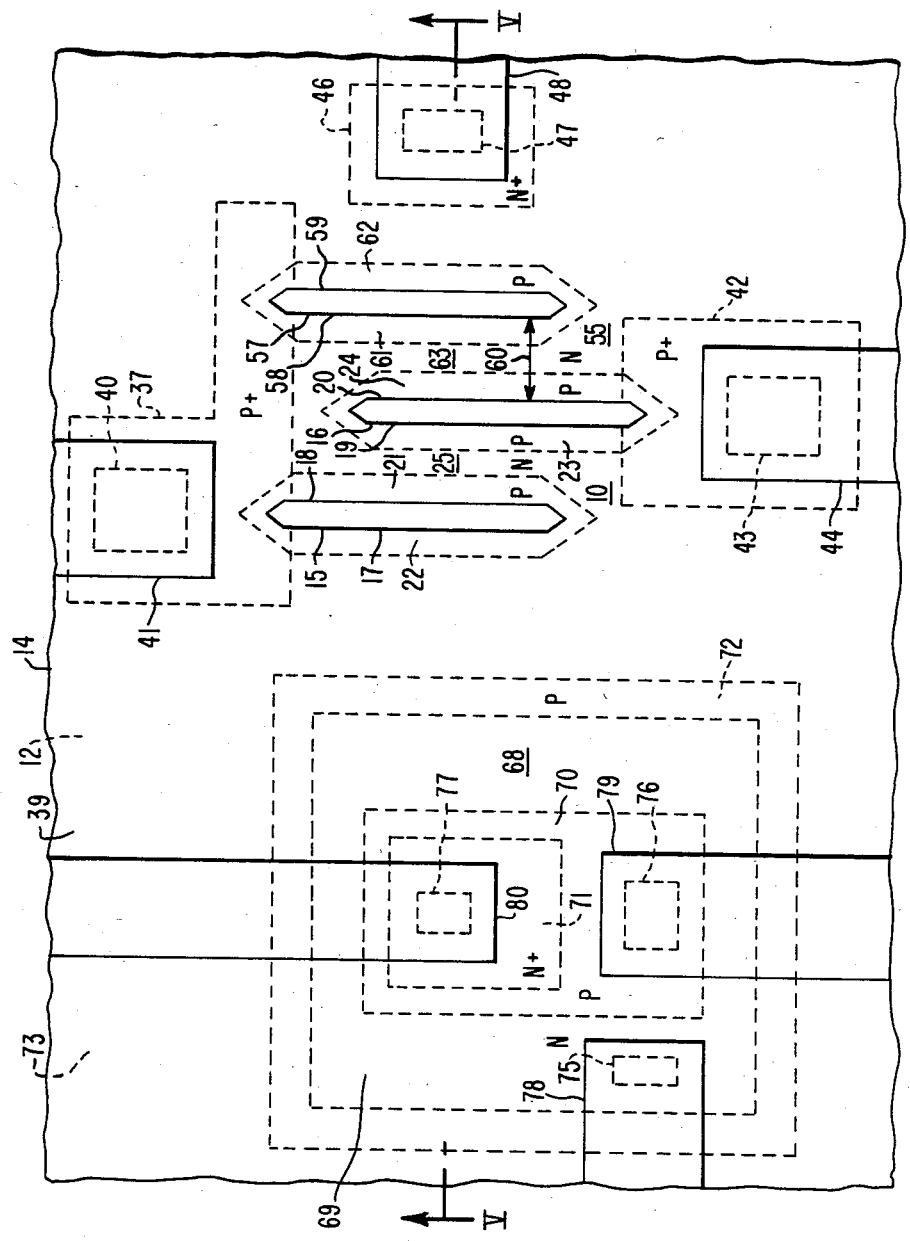
FIG. 4 is a plan view of an alternate embodiment of the invention.

FIG. 4 shows an alternate embodiment of the invention wherein a plurality of grooves 15, 16 and 57 are used to form a plurality of bipolar transistors 10 and 55 which may be coupled in parallel as shown in FIG. 4. In FIG. 4 like references are used for functions corresponding to the embodiment of FIG. 1.

In FIG. 4, groove 57 has been formed next to grooves 15 and 16 having sidewalls 58 and 59 which may be spaced apart by 0.6 micrometers. Groove 57 may be longitudinally parallel to groove 16 and spaced apart by 3 micrometers shown by arrow 60. P type impurities may be deposited on sidewalls 58 and 59 and driven in by diffusion to form regions 61 and 62. Region 63 may be the space between regions 24 and 61 and represents the base of PNP transistor 55 having region 24 as its collector and region 61 as its emitter or vice versa.

Thus alternatively, regions 23 and 24 may be the emitter and regions 21 and 61 may be the collector for transistors 10 and 55, respectively. Since all lateral current from regions 23 and 24 would be utilized as emitter current, transistors 10 and 55 would have improved emitter efficiency. Regions 23 and 24 would form a double sided emitter which is preferred. Region 61 may extend 1 micrometer from sidewall 58 towards region 24 leaving a base width of 1 micrometer, for example. Additional PNP transistors may be added by forming additional grooves.

Figure 5A:
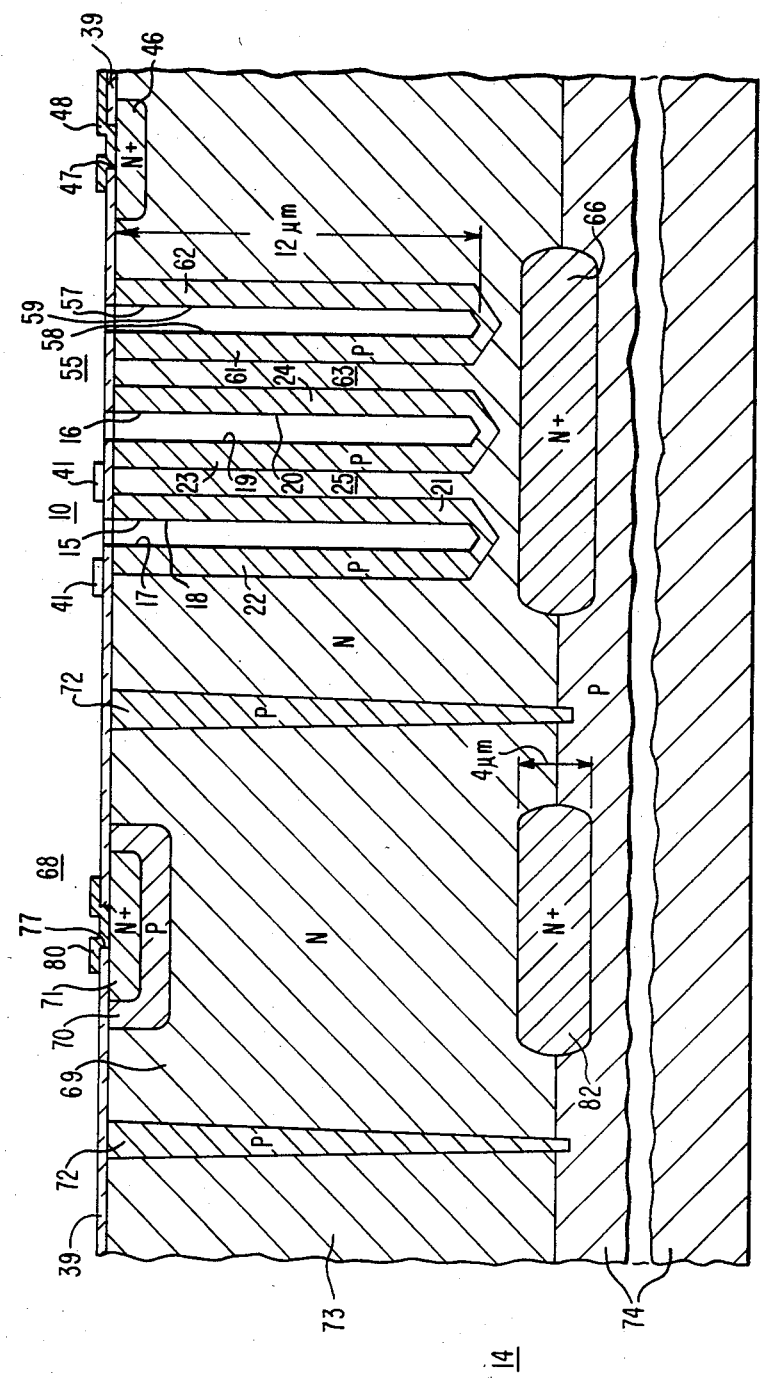
FIG. 5A is a cross-section view along the lines V—V of FIG. 4.
Figure 5B:
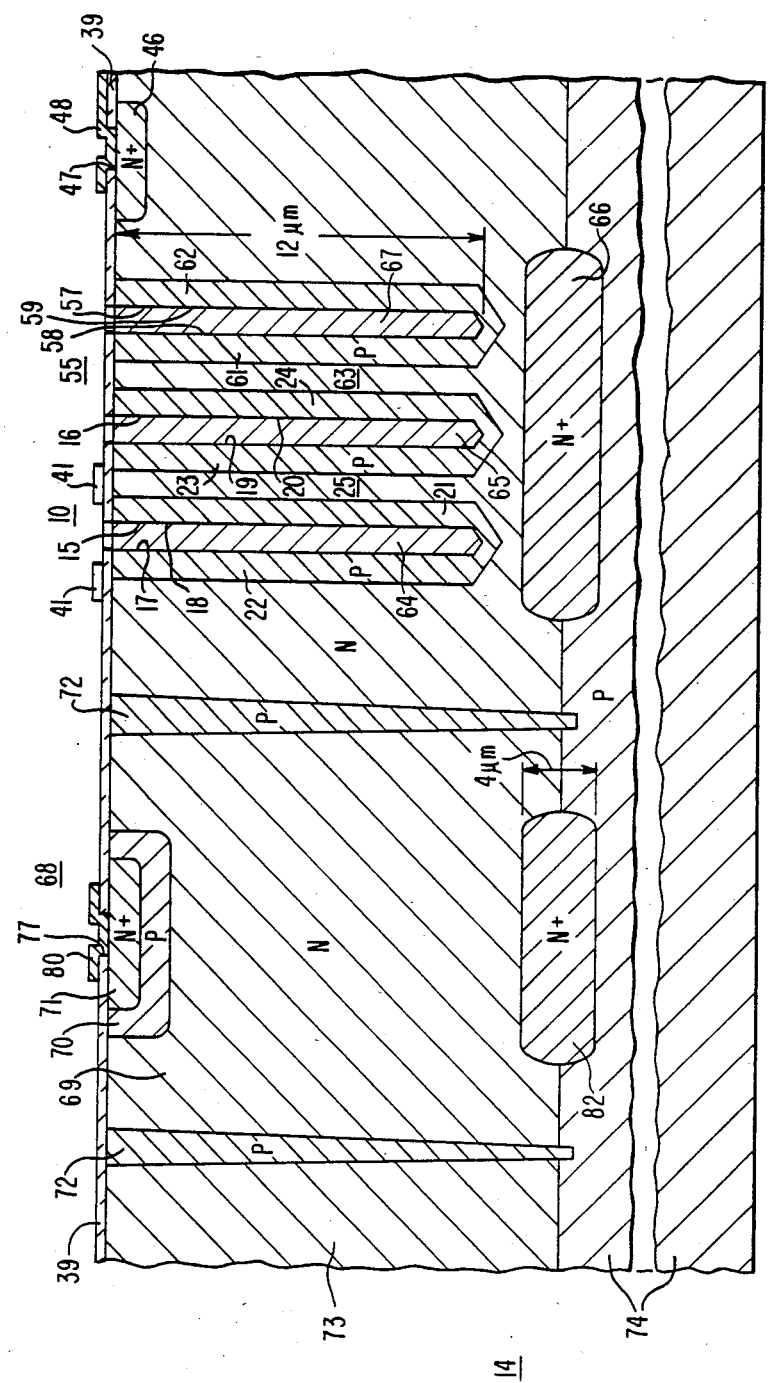
FIG. 5B is a cross-section view of an alternate embodiment of the invention.

A cross-section view of FIG. 4 along the lines V—V is shown in FIG. 5A. The grooves may be filled up by regrowing epitaxial P material 64, 65 and 67 in grooves 15, 16 and 57 as shown in FIG. 5B to lower the resistance in the longitudinal direction of the grooves (sidewalls) for maximum current transfer. Except for material 64, 65 and 67 in grooves 15, 16, and 57, FIG. 5B conforms to FIG. 5A. Buried N+ region 66 shown in FIGS. 5A and 5B is positioned below PNP transistors 10 and 55 to reduce the vertical component of emitter current approaching region 66.

A vertical NPN bipolar transistor 68 is also shown in FIGS. 4 and 5A. Transistor 68 has a collector region 69, base region 70, and emitter region 71. A P isolation ring or diffusion or implant 72 is made through the N epitaxial layer 73 to the P material 74 below to form isolated N type region 69. Windows 75-77 in silicon dioxide layer 39 permit access for ohmic contact by conductors 78-80 respectively. A buried N+ region 82 shown in FIG. 5 is at the interface of region 69 in layer 73 and material 74. Region 82 may be 4 micrometers thick. Layer 73 and material 74 form substrate 14.

NPN transistor 68 is shown in addition to the plurality of PNP transistors 10 and 55 to illustrate the fabrication of complementary bipolar transistors on substrate 14.

The process or method for fabricating transistor 10 shown in FIG. 1 may, for example, be as follows. A wafer or substrate 14 of silicon material has an upper surface 12 with a (110) orientation and has a predetermined doping level such as from 1 to $5 \times 10^{16}$ atoms/cm$^3$ of N-type material. The N type material may be a layer 73 of epitaxial material overlying a P type material 74. In a small unused area on the upper surface 12 of the wafer, narrow slots may be etched each one angularly offset from the other by a degree or so to determine the location of the intersection of an internal (111) plane with the upper surface (110) plane. Subsequent masks are aligned with the (111) plane intersection to assure that the grooves 15 and 16, when formed, are aligned with the (111) plane at the upper surface and have vertical sidewalls 17-20 in the (111) plane.

An oxide layer 39 is formed over the wafer which may be thermal oxide or silox and functions as a mask for subsequent process steps. An opening in the oxide 39 is formed for the P+ diffusion or ion implantation of regions 37 and 42. P+ impurities are subsequently diffused or ion implanted through the openings to form regions 37 and 42. An opening is formed in oxide 39 to form region 46. N+ impurities are diffused or ion implanted into the opening to form region 46. Next, openings are formed in oxide 39 for grooves 15 and 16. Grooves 15 and 16 are formed by etching substrate 14 with potassium hydroxide and water. The duration of the etch is dependent upon the depth of the grooves which may, for example, be 20 micrometers.

Grooves 15 and 16 may also be formed by plasma etch in which case the crystalline orientation of the surface 12 of substrate 14 is no longer required to be in the (110) plane and the grooves and its sidewalls are no longer required to be longitudinal slots or in straight paths.

Next, a P+ deposition of impurities are formed in grooves 15 and 16 followed by a high temperature drive to diffuse P-type impurities into sidewalls 17 through 19 to a predetermined depth such as 1 micrometer.

Additional silicon dioxide 39 (silox) is then deposited over the upper surface 12 of substrate 14. Openings 40, 43 and 47 are formed in silicon dioxide 39. A conductive material is deposited over silicon dioxide layer 39 and over openings 40, 43 and 47. The conductor material may be, for example, polysilicon or aluminum. The conductor material is subsequently etched to form conductors 41, 44 and 48.

The above process steps are compatible with the formation of an NPN vertical transistor structure at the same time the lateral bipolar transistor is formed which may, for example, be a PNP transistor. The process steps to form the NPN vertical transistor may precede the process steps to form the PNP lateral transistor. First a P type region 72 is diffused in a shape to isolate region 69. The base region 70 of P type material is then diffused or implanted. Next the emitter region 71 of N type material is diffused or implanted. Silicon nitride 500 Angstrom thick may be used to cover the emitter region of the NPN transistor during deposition and drive of the P regions for the PNP transistor. Alternately, the concentrations of the P regions of the PNP transistor may be below the concentration of the emitter region of the NPN transistor so as not to change the N type material of the emitter after P type diffusion therein. Ohmic contact to both the PNP and NPN transistors may be made by opening windows through the dielectric 39 to selected regions followed by deposition of conductive material which may be etched to form individual conductors 41, 44, 48, 78, 49 and 80.

Figure 6:
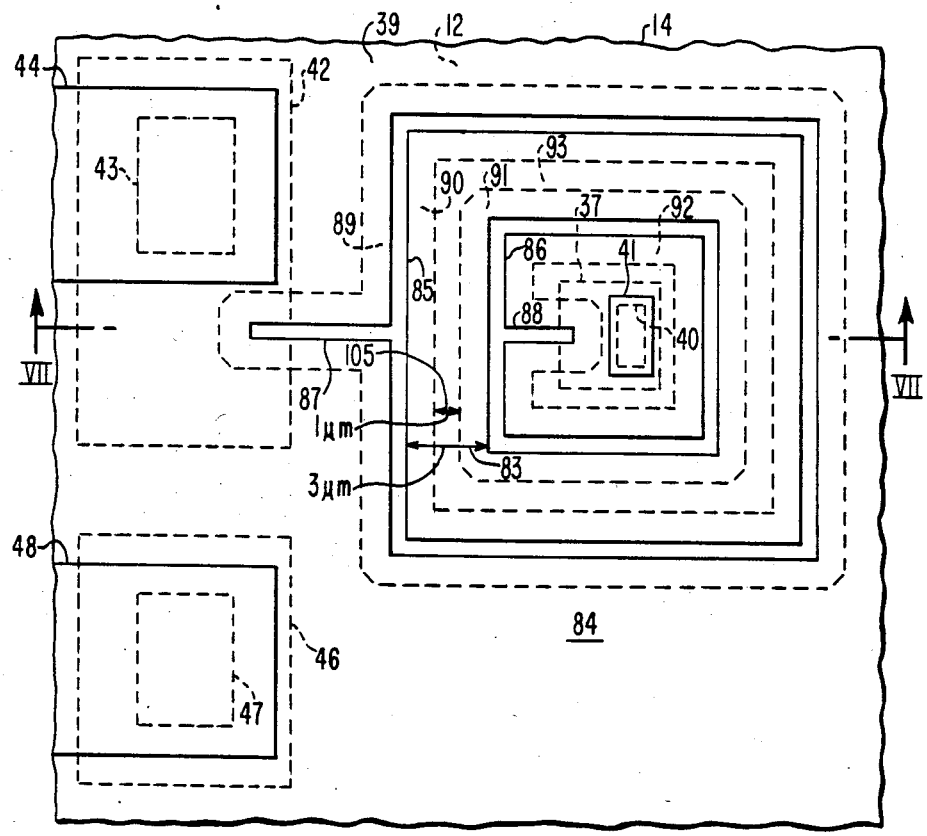
FIG. 6 is an alternate embodiment of the invention.
Figure 7:
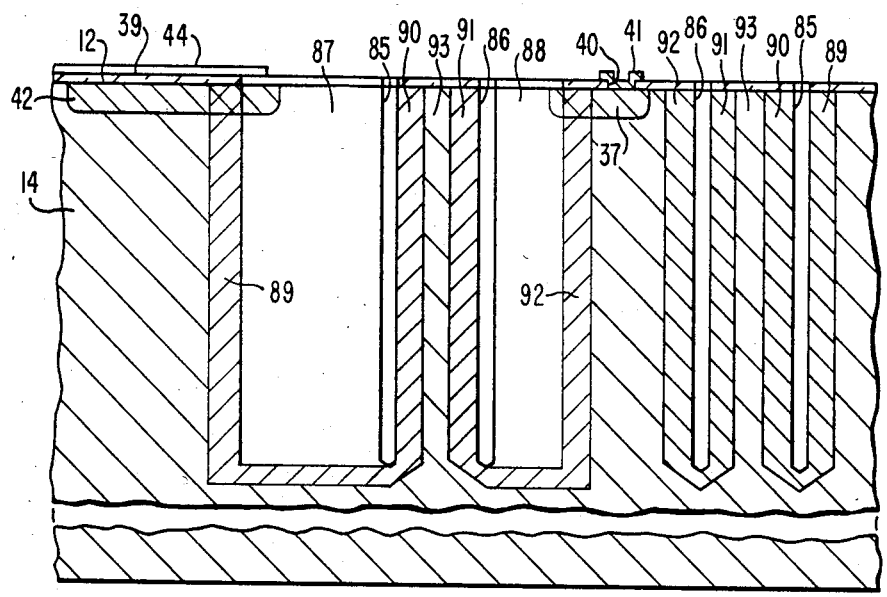
FIG. 7 is a cross-section view along the lines VII—VII of FIG. 6.

FIG. 6 shows an alternate embodiment of the invention. In FIG. 6 like references are used for functions corresponding to the apparatus of FIG. 1. In FIG. 6 narrow grooves 85 and 86 are formed in substrate 14 which are spaced apart from each other by a distance such as 3 micrometers shown by arrow 83. Groove 85 traces a rectangular path in upper surface 12 of substrate 14. Groove 86 likewise forms a rectangle in upper surface 12 of substrate 14. Narrow groove 87 intersects with groove 85 and functions to form a conductive path to region 42. Groove 88 intersects with groove 86 and functions to form a conductive path to region 37. It is understood that all or a portion of the grooves may be formed by plasma etching. Regions 89 and 90 may be formed by depositing P type material on the sidewalls of grooves 85 and 87 followed by a diffusion drive causing P type impurities to travel laterally into the sidewalls 85 and 87 to a depth of, for example, one micrometer. P type regions 91 and 92 are likewise formed by deposition of P type materials in grooves 86 and 88 followed by a drive diffusion of the P type materials laterally with respect to grooves 86 and 88 to a depth of, for example, 1 micrometer. Region 93 is a space between regions 90 and 91 and may consist of the original doping of substrate 14 which may be N type thereby formed a lateral PNP transistor with respect to regions 91, 93 and 90. Region 93 would be the base of the transistor and have a base width of approximately 1 micrometer. The adjacent sides of grooves 85 and 86 are positioned parallel to one another, respectively, to provide a uniform base width shown by arrow 105 between regions 90 and 91 except for the corners. Region 89 is then in conductive contact with region 42 which is facilitated by groove 87. Region 92 is in conductive contact with region 37 which is facilitated by groove 88. Regions 89 and 90 are in conductive contact through the bottom of the groove 85 and regions 91 and 92 are in conductive contact through the bottom or underneath groove 86. FIG. 7 shows a cross-section view along lines VII—VII of FIG. 6. In FIG. 7 region 93 is shown having a uniform base width between regions 90 and 91 with a very large vertical junction area to allow maximum lateral current. In FIG. 6 transistor 84 may have an emitter contact shown by conductor 41, a collector contact shown by conductor 44 and a base contact shown by conductor 48. It is understood that the emitter and collector may be interchanged and while a PNP transistor has been shown a lateral NPN transistor may likewise be shown by having substrate 14 of P type material and regions 90 and 91 of N type material.

Figure 8:
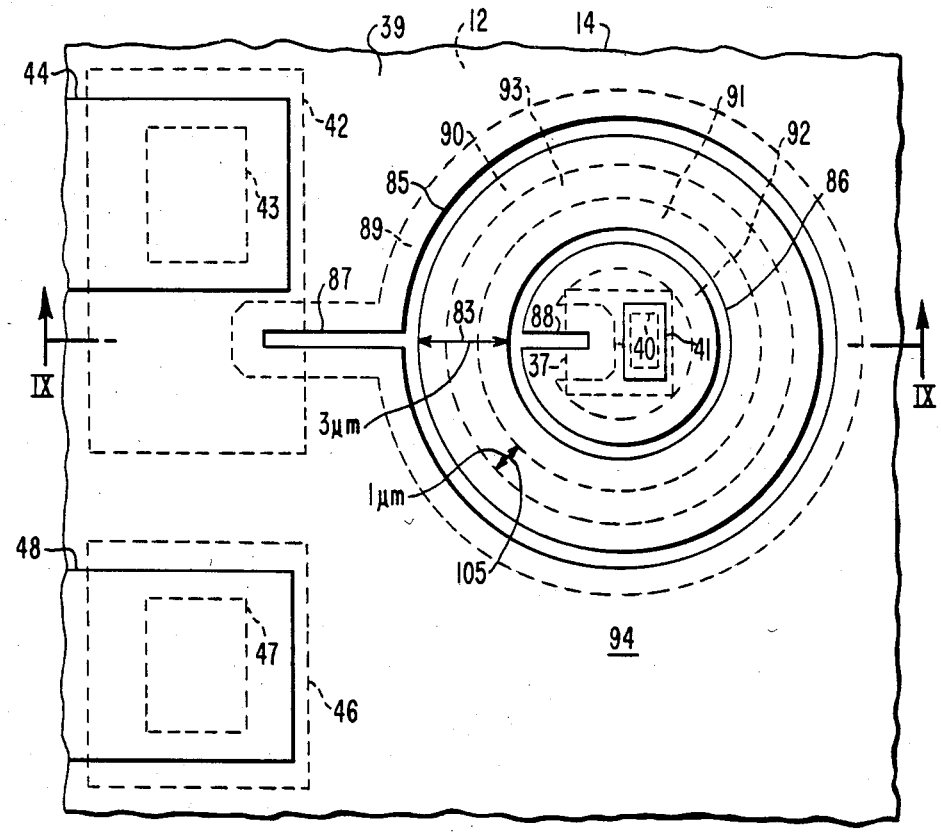
FIG. 8 is an alternate embodiment of the invention.
Figure 9:
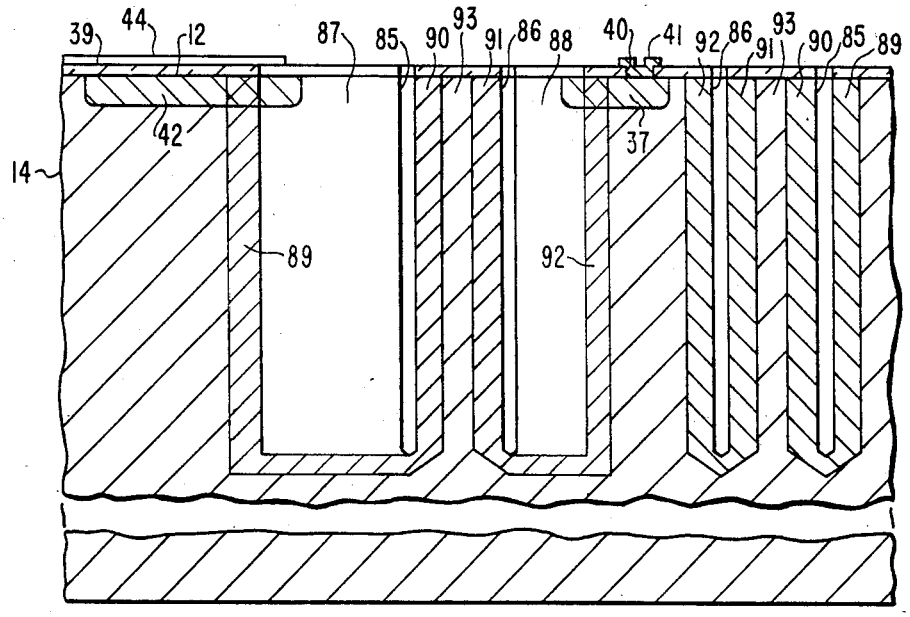
FIG. 9 is a cross-section view along the lines IX—IX of FIG. 8.

FIG. 8 shows an alternate embodiment of the invention. FIG. 9 shows a cross-section view along lines IX—IX of FIG. 8. In FIG. 8 like references are used for functions corresponding to the apparatus of FIG. 6. Grooves 85 and 86 form circular paths which are concentric and evenly spaced from one another as opposed to forming rectangular paths in FIG. 6. Grooves 85 and 86 are formed, for example, by plasma etching. The base width of transistor 94 is of uniform width shown by arrow 105. Region 93 is the region between regions 90 and 91 and forms the base of transistor 94.

Figure 10:
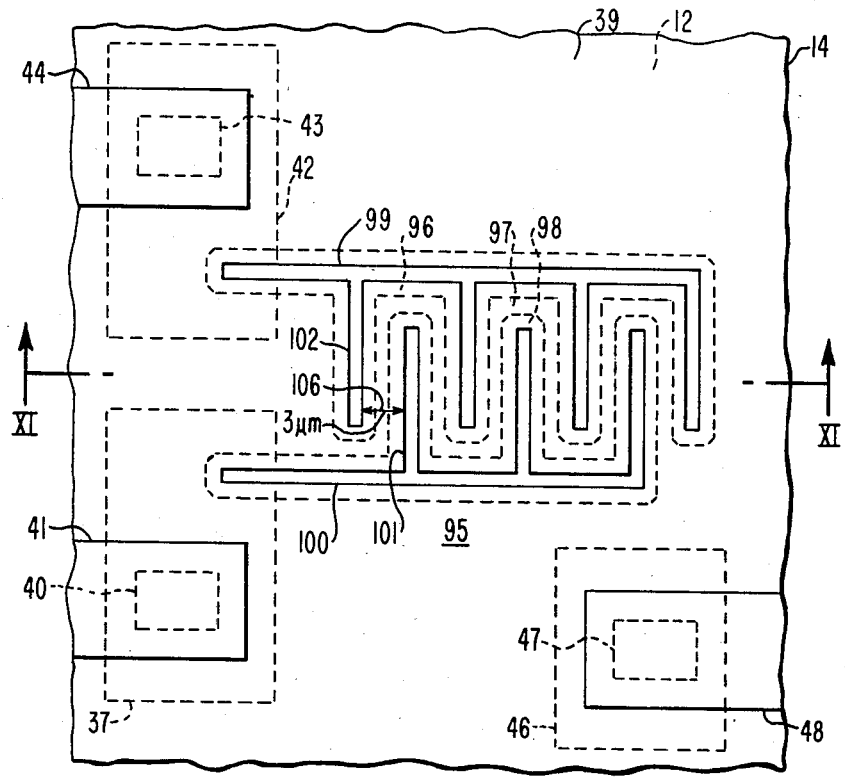
FIG. 10 is an alternate embodiment of the invention.

FIG. 10 shows an alternate embodiment of the invention. In FIG. 10 like references are used for functions corresponding to the apparatus of FIG. 1. FIG. 10 shows transistor 95 which is formed by regions 96, 97 and 98 to form a PNP transistor or an NPN transistor depending upon the doping of the regions. Grooves 99 and 100 are formed in upper surface 12 of substrate 14 such as by plasma etching to form an interdigitated structure such as two combs having the teeth of one comb positioned between the teeth of the other comb and equally spaced. P+ material may be deposited in grooves 99 and 100 followed by a drive diffusion of P type materials into the sidewalls of grooves 99 and 100 to form regions 96 and 98. Region 97 could be formed by driving impurities through the sidewalls of grooves 100 or groove 99 followed by the deposition of opposite impurities which are also driven through the same sidewalls to form alternating regions of N and P-type material. The diffusions may be driven laterally through sidewalls such as 0.5 to 2 microns in depth. The grooves which function to form sidewalls transverse to surface 12 themselves may be, for example in range, from 0.5 microns to 2 microns. Typical spacing between the fingers of grooves 99 and 100 is 3 micrometers shown by arrow 106. The interdigitated grooves 99 and 100 of FIG. 10 represent a serpentine structure which has been collapsed upon itself to form teeth. For example, finger 101 may be U-shaped and finger 102 may be U-shaped to form a serpentine structure of parallel sidewalls. As shown in FIG. 10 region 98 may be considered the emitter to optimize the emitter current because each finger such as finger 101 is utilized on both sides to provide transistor emitter current.

Figure 11:
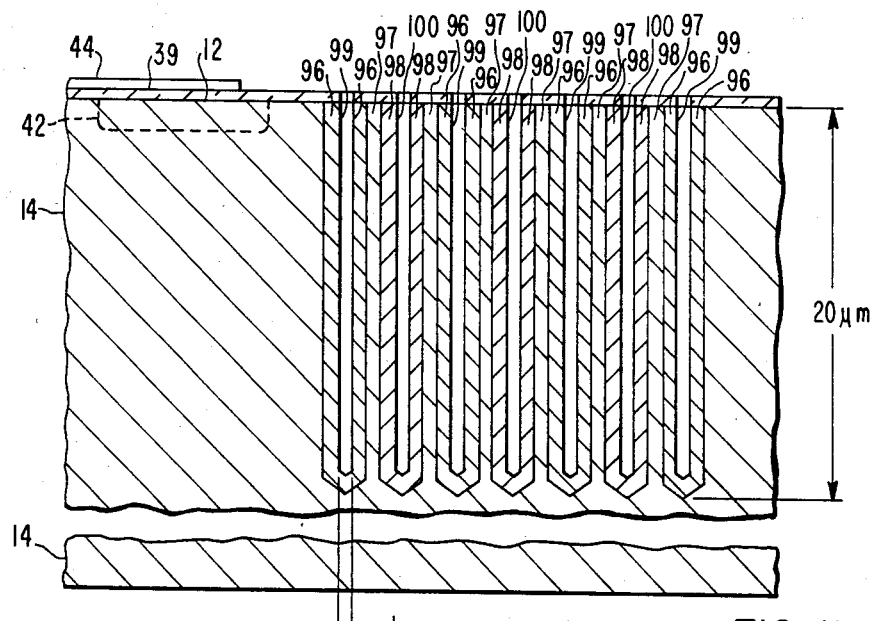
FIG. 11 is a cross-section view along the lines XI—XI of FIG. 10.

FIG. 11 shows a cross-section view along the lines XI—XI of FIG. 10 which shows regions 96, 97 and 98. Region 97 would act as a base and as can be seen in FIG. 11 has fairly uniform base width. High efficiency in emitter junction current is obtained by this structure since lateral current across the junction from regions 98 to 97 is high compared with the vertical current below region 98 below groove 100. Grooves 99 and 100 function to form sidewalls and may, for example, be 20 micrometers deep and 1 micrometer wide. Conduction to region 96 is provided by diffusion 42 and conductor 44. Conduction to region 98 is provided by diffusion 37 or implant 37 and conductor 41. Conduction to the base region 97 or substrate 14 is provided by region 46 and conductor 48.

A lateral bipolar transistor and the method of making it has been described wherein vertical surfaces are formed in the upper surface of a substrate from which regions doped with impurities may be formed and spaced apart by a predetermined amount to form a desired transistor base width which is fairly uniform when the adjacent sidewalls of adjacent grooves are oriented parallel to one another. Interconnections may be formed to the regions extending from the sidewalls of the groove by diffusions in the upper surface which intersect with the regions extending from the sidewalls functioning as one or more emitters and a second region formed in the upper surface intersecting with the regions extending from the sidewalls functioning as one or more collectors. In one embodiment the grooves may be longitudinally staggered corresponding to emitter and collector regions. In another embodiment, the grooves may trace out concentric rectangles, circles or rings, serpentine paths or interdigitized combs.

The invention provides a lateral PNP transistor having high current gain and high frequency response which may be fabricated concurrently with vertical NPN transistors.

I claim:

1. A bipolar transistor comprising:
   a substrate of semiconductor material having an upper surface and a predetermined crystalline orientation;
   said substrate doped with impurities of a first type;
   first and second regions spaced apart and doped with impurities of a second type;
   a plurality of grooves numbered in sequence to form even numbered and odd numbered grooves formed in said substrate adjacent one another from said upper surface and having spaced apart side walls between adjacent grooves;
   said side walls being doped with impurities of said second type;
   said even numbered grooves intersecting said first region; and
   said odd numbered grooves intersecting said second region.

2. The transistor of claim 1 wherein said semiconductor material is monocrystalline silicon and wherein said upper surface is in the (110) plane.

3. The transistor of claim 1 wherein said impurities of a first type are N type.

4. The transistor of claim 2 wherein said substrate includes a layer of epitaxial material.

5. The transistor of claim 1 wherein said even numbered, and odd numbered grooves are longitudinally aligned parallel to one another.

6. The transistor of claim 2 wherein said sidewalls are substantially in the (111) crystalline plane.

7. The transistor of claim 1 wherein said impurities of a second type are P type.

8. The transistor of claim 1 wherein said grooves are on the order of 1 micrometer wide.

9. The transistor of claim 1 wherein the areas of said sidewalls have substantial portions facing each other.

10. The transistor of claim 1 wherein the area of each side wall is an order of magnitude larger than the area of the bottom surface of each groove.

* * * * *